(12) United States Patent
Yang et al.

(10) Patent No.: US 6,515,328 B1
(45) Date of Patent: Feb. 4, 2003

(54) SEMICONDUCTOR DEVICES WITH REDUCED CONTROL GATE DIMENSIONS

(75) Inventors: Wenge Yang, Fremont, CA (US); Lewis Shen, Cupertino, CA (US); Mark Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 198 days.

(21) Appl. No.: 09/244,429

(22) Filed: Feb. 4, 1999

(51) Int. Cl.[7] .............. H01L 29/788; H01L 23/48; H01L 23/52; H01L 29/40

(52) U.S. Cl. .............. 257/315; 257/756; 438/593

(58) Field of Search ............... 257/315, 756; 438/593

(56) References Cited

U.S. PATENT DOCUMENTS

| 4,836,887 A | | 6/1989 | Daubenspeck et al. |
| 4,923,828 A | * | 5/1990 | Gluck et al. .................. 134/1.2 |
| 5,290,721 A | * | 3/1994 | Yoshimi et al. .............. 438/593 |
| 5,345,104 A | * | 9/1994 | Prall et al. ................... 257/607 |
| 5,429,969 A | * | 7/1995 | Chang ........................ 438/593 |
| 5,626,775 A | | 5/1997 | Roberts et al. |
| 5,635,731 A | * | 6/1997 | Ashida ......................... 257/67 |
| 5,668,380 A | * | 9/1997 | Wuu et al. ..................... 257/66 |
| 5,973,353 A | * | 10/1999 | Yang et al. .................. 257/315 |

* cited by examiner

Primary Examiner—Olik Chaudhuri
Assistant Examiner—Howard Weiss

(57) ABSTRACT

The use of chlorine and oxygen chemistry in a polysilicon etch environment provides a process to etch a plurality of silicon-based layers on a semiconductor substrate to an underlying oxide layer in a single step. The process is useful in the formation of gate structures wherein high selectivity to the underlying oxide layer thereby affords higher processing control over the formed gate structure.

10 Claims, 6 Drawing Sheets

SEMICONDUCTOR DEVICES WITH REDUCED CONTROL GATE DIMENSIONS

FIELD OF THE INVENTION

The present invention relates to a method of manufacturing a semiconductor device wherein a multilayered structure is etched to form a pattern therein. The invention is particularly useful in etching a plurality of silicon-based layers at high etch rates and at a high etch rate ratio to an underlying dielectric layer using a chlorine and oxygen etch chemistry.

BACKGROUND ART

The escalating requirements for high densification and performance associated with ultra large-scale integration (ULSI) semiconductor devices requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

Conventional semiconductor devices comprise a substrate and various structural layers thereon, in which individual circuit components are formed. The formation of various circuit components is partly accomplished by employing conventional photolithographic techniques to form a mask on the substrate and further etching through openings in the photoresist-mask to one or more layers of the substrate. Practically all semiconductor devices incorporate a multitude of such patterning and etching processes.

An exemplary memory cell 8, of a conventional memory device, is depicted in FIG. 1A, viewed in a cross-section through the bit line. Memory cell 8 includes a doped substrate 12 having a top surface 11, and a source region 13a and a drain region 13b formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polycrystalline silicon (polysilicon).

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a binary charge corresponding to either a 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1B depicts a cross-section of several adjacent memory cells from the perspective of a cross-section through the word line (i.e., from perspective A, as referenced in FIG. 1A). In FIG. 1B, the cross-section reveals that individual memory cells are separated by isolating regions of silicon dioxide formed on substrate 12. For example, FIG. 1B shows a portion of a floating gate 16a associated with a first memory cell, a floating gate 16b associated with a second memory cell, and a portion of floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a and 14b. Interpoly dielectric layer 24 has been conformally deposited over the exposed portions of floating gates 16a, 16b, and 16c and field oxides 14a and 14b. Interpoly dielectric layer 24 isolates floating gates 16a, 16b and 16c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the basic features depicted in the memory cells of FIGS. 1A and 1B, place a burden on the fabrication process to deposit and subsequently pattern a layer stack to form a floating gate/control gate structure, without creating deleterious effects within the resulting memory cells.

Of particular importance in memory devices is the formation and dimensions of the gate electrode. Gate dimensions are critical since the gate electrode controls the flow of electrons and is vital to proper device operation. As described above, a gate electrode is formed by depositing a polysilicon film at a uniform thickness and by subsequent deposition of necessary device layers with further processing steps thereto. The polysilicon layer employed in the control gate is typically deposited at a thickness of about 1500 Å which is greater than the thickness of the corresponding polysilicon layer in the floating gate. The greater thickness of the control gate is necessary to compensate for process limitations in the formation of a memory stack structure.

A semiconductor substrate having a conventional memory stack 10 is shown in FIG. 2. The memory stack comprises a plurality of layers including a tunnel oxide layer 15 overlying substrate 12, a first polysilicon layer 16 on tunnel oxide 15, an ONO layer 24 on polysilicon layer 16, a second polysilicon layer 26 on ONO layer 24, and a silicide layer 28 on polysilicon layer 26. The memory stack also includes a polysilicon cap layer 30 overlying silicide layer 28 and a silicon oxynitride layer 32 on polysilicon cap layer 30.

FIG. 3 illustrates a flow diagram employing a conventional etch process in the preparation of memory stack 10 of FIG. 2. The method begins in step 40, where the multi-layer semiconductor substrate having a silicon oxynitride top layer is covered with a photoresist layer. The photoresist layer is then patterned in step 42 to form a photoresist mask exposing select regions of the underlying silicon oxynitride layer. The semiconductor substrate is then inserted into an oxide etch chamber in step 44, and an oxide etching operation is performed to etch the exposed regions of the underlying silicon oxynitride layer to expose the underlying poly cap layer. The semiconductor substrate is then moved in step 46 from the oxide etch chamber to a polysilicon etch chamber, where a polysilicon etch process is performed on poly cap layer 30 and silicide layer 28.

Conventional etch chemistry and equipment requires that a high selectivity to the silicide be achieved so that all of silicide layer 28 can be cleared while the underlying polysilicon layer 26 remains intact. However, achieving a high selectivity is difficult using conventional processes particularly since the silicide and polysilicon layers have similar etching properties. Thus, to ensure the complete etching of silicide layer 28 requires the partial etching of underlying polysilicon 26. The resulting structure is depicted in FIG. 4, where the numerals represent layers as described for FIG. 2 (the patterned photoresist layer is not shown for illustrative convenience).

Further, should polysilicon underlayer 26 be erroneously removed during etching of silicide layer 28, conventional silicide etch processes would rapidly etch underlying oxide layer 24 resulting in deleterious pitting therein. The inability to achieve high selectivity to polysilicon during etching of silicide has conventionally been compensated for by providing a thick polysilicon layer. Conventionally, silicide layers are etched employing a fluorine source and a substrate temperature of 65° C. to yield a selectivity of silicide to polysilicon of 1:1. However, the fluorine chemistry rapidly etches oxides.

Subsequent to etching the silicide layer, polysilicon layer 26 is etched in step 48. The etch process of step 48 requires a separate etching step with a different etch chemistry such that a higher selectivity to the underlying oxide can be achieved. The etch chemistry employed in step 48 must have a higher selectivity to the underlying oxide than the silicide etch chemistry employed in step 46 otherwise the same pitting problem would occur.

Hence, conventional techniques for etching silicon-based layers requires at least a two step process of first etching a poly cap and silicide layer to an underlying polysilicon layer and a second, separate etching step consisting of different etching chemistry and parameters to etch the polysilicon layer to an underlying oxide layer. Further, a high selectivity to polysilicon is required during the first silicide etch to avoid removing the underlying polysilicon and deleteriously affecting the oxide layer. Since this high selectivity is difficult to achieve, a thick polysilicon layer is required to compensate for over etching the silicide layer thereby resulting in a thicker control gate electrode.

Accordingly, there is a continuing need for improved processes for manufacturing semiconductor substrates having multiple silicon-based layers that minimize etching steps and a continuing need for fabrication processes that permit improved control over the dimensions of gate electrodes.

SUMMARY OF THE INVENTION

There is a need for manufacturing a semiconductor device by etching a plurality of silicon layers to reduce process variation and processing steps.

There is also a need for a semiconductor substrate with a control gate having a reduced thickness.

According to the present invention, the foregoing and other objects are achieved in part by a method of etching a semiconductor substrate having a plurality of silicon-based layers. The method comprises etching the silicon-based layers in an etching chamber by exposing the semiconductor substrate to a mixture of chlorine ($Cl_2$) and oxygen ($O_2$). The use of $Cl_2$ and $O_2$ in a polysilicon etch environment permits etching of the plurality of silicon layers in a single step avoiding a separate polysilicon etching step for the formation of a control gate electrode. Further, since the $Cl_2$ and $O_2$ chemistry has good selectivity to dielectric materials, it avoids pitting of a underlying dielectric layer which can result with conventional silicide etching techniques.

Another aspect of the present invention is a method of etching a semiconductor substrate having a plurality of silicon-based layers overlying the semiconductor substrate to achieve a thinner control gate electrode. The method comprises etching the plurality of silicon-based layers in a single polysilicon etch environment to form a control gate electrode of no greater than about 800 Å thick. The $Cl_2$ and $O_2$ chemistry permit etching a plurality of silicon-based layers comprising a silicide layer over a polysilicon layer in a single step, thus avoiding the need to deposit a thick polysilicon underlayer to compensate for over-etching of the silicide layer. A semiconductor device comprising a polysilicon layer having a thickness no greater than about 800 Å can thus be fashioned.

Additional advantages of the present invention will become readily apparent to those having ordinary skill in the art from the following detailed description, wherein the embodiments of the invention are described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

DETAILED DESCRIPTION OF THE INVENTION

The present invention stems from the discovery that the use of chlorine and oxygen chemistry in a polysilicon etch environment provides a process to etch a plurality of silicon-based layers in a single step with good selectivity to an underlying dielectric or insulator layer thereby affording higher processing control over the gate electrode.

Figure 1A:
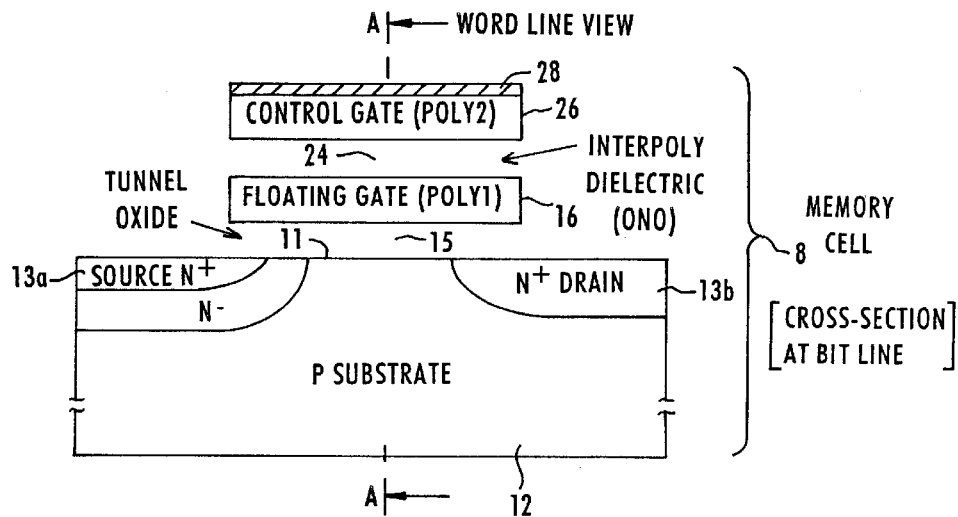
FIGS. 1A and 1B are diagrams illustrating cross-sectional views of a portion of a conventional semiconductor memory cell device along bit-line and word-line views, respectively.
Figure 1B:
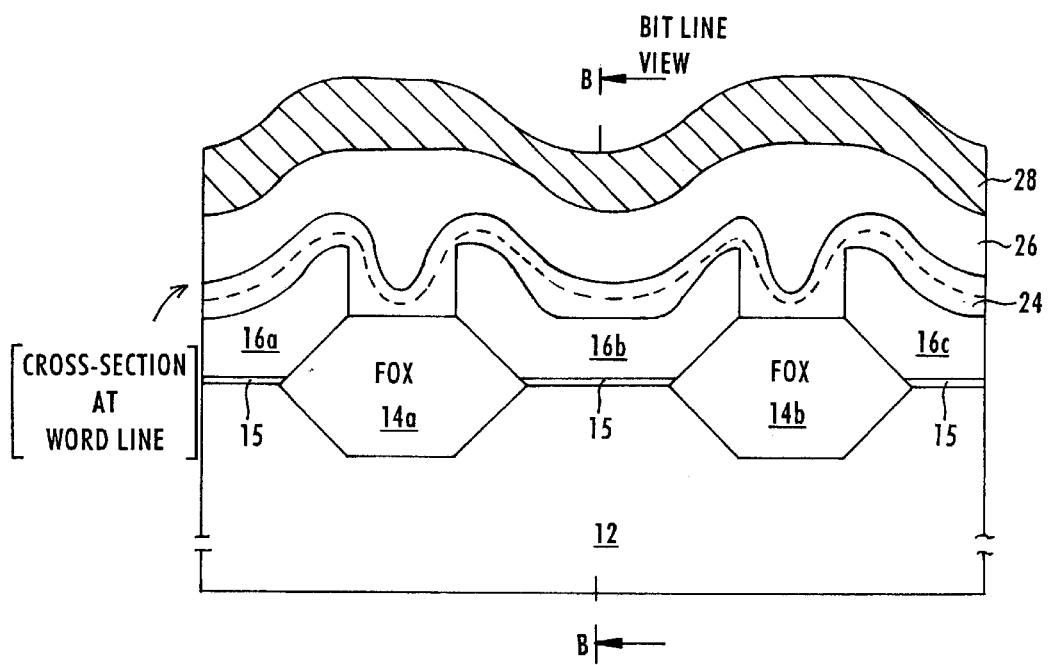
Figure 2:
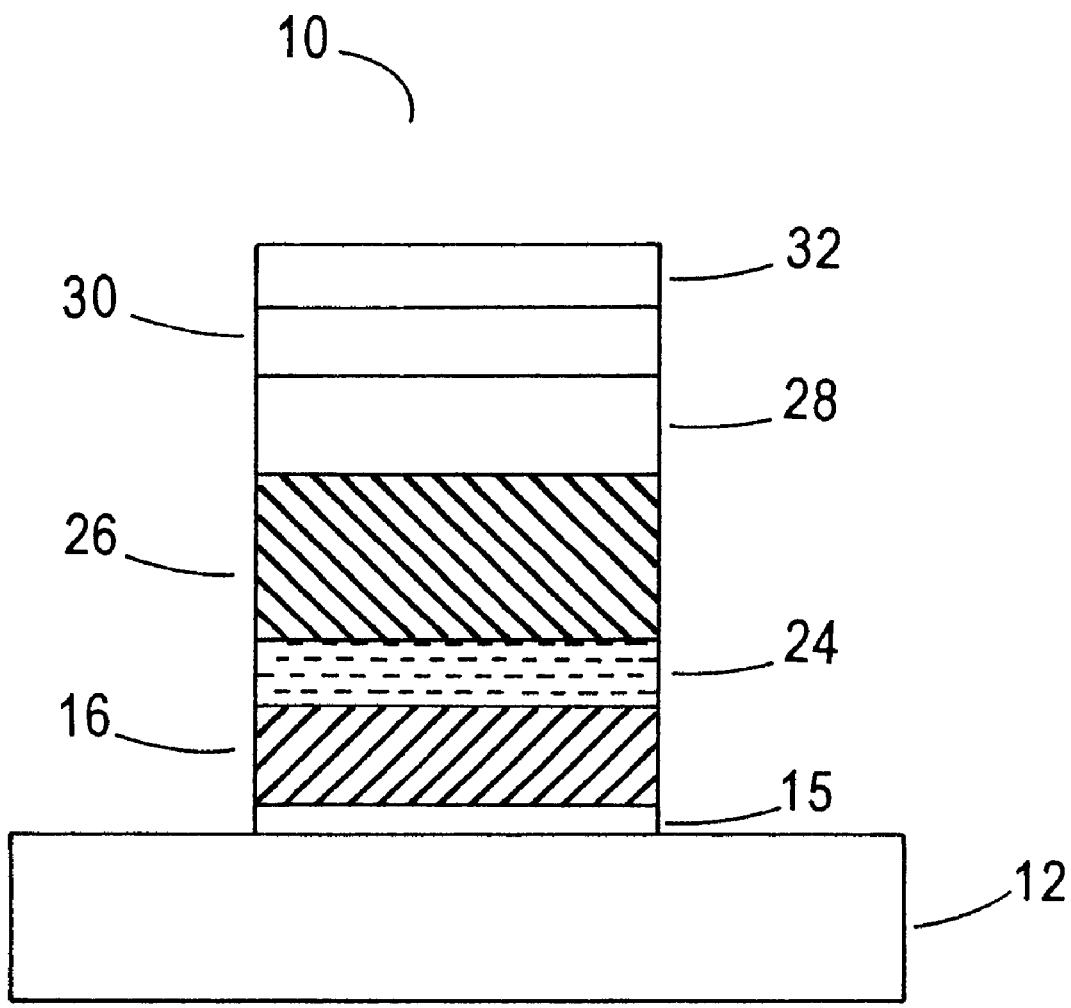
FIG. 2 is a diagram illustrating a cross-section of a portion of a semiconductor device having a patterned conventional layer stack.
Figure 3:
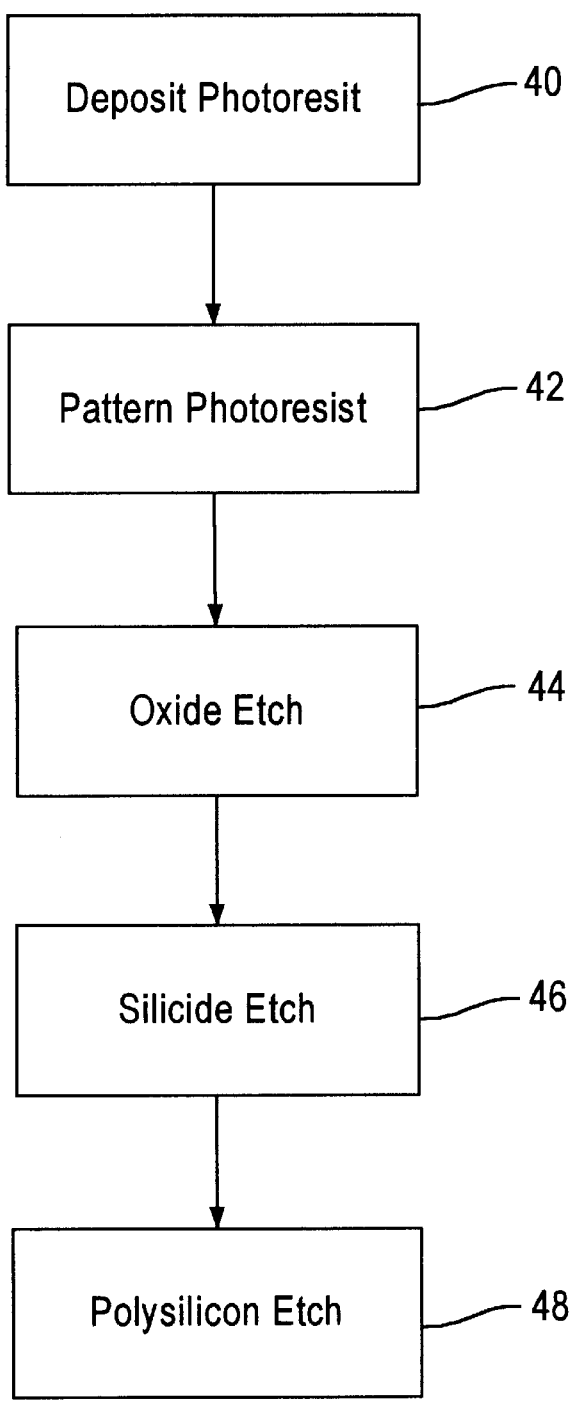
FIG. 3 is a diagram illustrating a prior art method for etching a plurality of layers.
Figure 4:
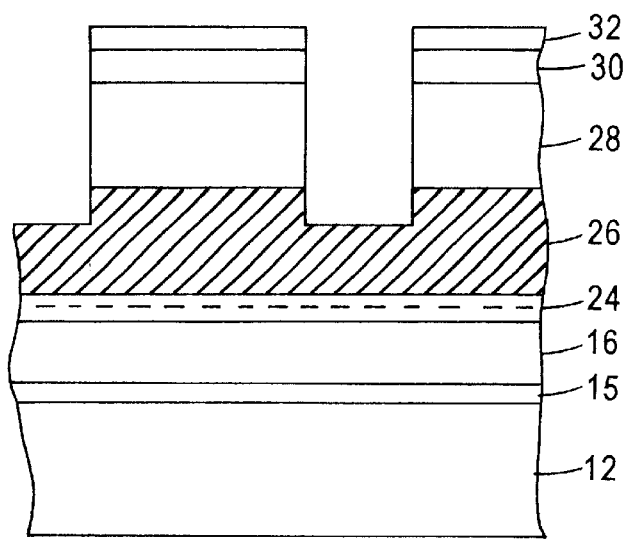
FIG. 4 is a diagram illustrating a cross-sectional view of a semiconductor device memory gate having a partially etched patterned stack layer.
Figure 5:
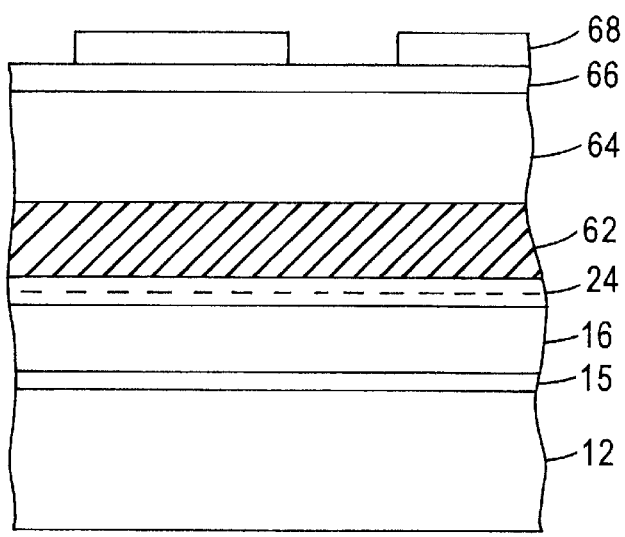
FIG. 5 is a diagram illustrating a cross-sectional view of a plurality of layers on a semiconductor substrate having a patterned silicon oxynitride layer thereon.

In an embodiment of the present invention, FIG. 5 is a diagram of a semiconductor substrate having a plurality of layers formed thereon. The substrate and layers thereon include a tunnel oxide layer 15 overlying silicon substrate 12, a first polysilicon layer 16 overlying on tunnel oxide layer 15, and an oxide-nitride-oxide (ONO) layer 24 overlying on first polysilicon layer 16. The layers further include a second polysilicon layer 62 overlying on ONO layer 24, a silicide layer 64 overlying on second polysilicon layer 62, a polysilicon cap layer 66 overlying on the silicide layer 68, and a patterned silicon oxynitride (SiON) layer 68 overlying on polysilicon cap layer 66. The silicon oxynitride layer 68 serves as an antireflective coding (ARC) layer, and hence may be used for many reduced-size critical dimension semiconductor devices. Both the polysilicon cap layer 66 and the silicon oxynitride layer 68 are deposited using conventional chemical vapor deposition (CVD) or plasma enhanced chemical vapor deposition (PECVD) techniques. The polysilicon cap layer 66 typically includes undoped polysilicon and the silicon oxynitride layer 68 includes silicon oxynitride (e.g., $SiO_xN_y$, wherein x and y represent the atomic percentage of oxygen and nitrogen, respectively).

The layers are configured for submicron memory devices, and have a height of between about 3,500 Angstroms to about 5,000 Angstroms. The tunnel oxide layer 15 is about 50 Angstroms thick, and is thermally grown on substrate 12. The polysilicon layer 16 is a doped polysilicon layer formed on the tunnel oxide 15 using conventional CVD or PECVD techniques to a thickness of about 500 to about 1,100 Angstroms, and is used in the memory device as the floating polysilicon gate. The interpoly dielectric layer (ONO) 24 is then formed overlying on the polysilicon layer 16 using conventional deposition techniques to a total thickness of about 150 to about 200 Angstroms. As recognized in the art, the ONO layer 24 is used in the device as a dielectric spacer and may be formed by a three-stage process including forming a first film of silicon dioxide on the polysilicon layer 16, depositing a film of silicon nitride on the silicon dioxide, and then depositing a second film of silicon dioxide on the silicon nitride film.

The second polysilicon layer 62 is then deposited on the ONO layer 24 to a thickness of no greater than about 800 Angstroms, e.g. a thickness no greater than about 400 Angstroms. The second polysilicon layer 62 is used in the memory device as part of the control gate electrode and can be deposited as thin as necessary to perform its desired function. The thickness is thereby limited only by the need for a control gate electrode comprising a polysilicon layer. In an embodiment of the invention, the polysilicon layer can be deposited to a thickness of no greater than about 200 Angstroms.

The silicide layer 64 (comprising $WSi_x$, for example) is then formed using conventional silicide forming techniques to a thickness of about 800 Å to 2000 Å. The polysilicon cap layer 66 is then formed to a thickness of about 400 to about 800 Angstroms. The silicon oxynitride layer 68 is then deposited overlying on the polysilicon cap layer 66. Although an embodiment uses silicon oxynitride as the antireflective coating layer 68, alternative cap layer materials may be used that include a controllable atomic percentage of nitrogen, for example, silicon oxime. The silicon oxynitride layer 68 is formed to a thickness of about 400 Å–1200 Å.

Figure 7:
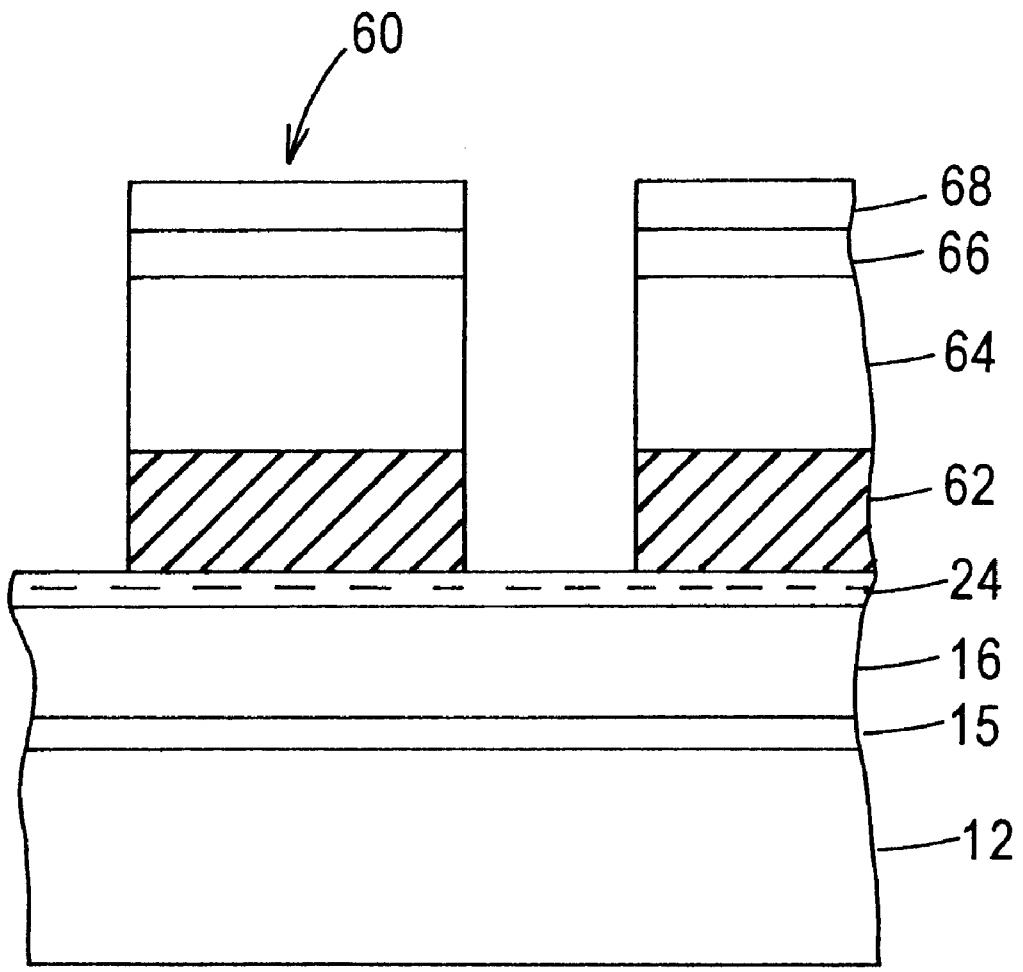
FIG. 7 is a diagram illustrating a cross-sectional view of a patterned stack layer formed in accordance with the present invention.

According to the disclosed embodiment, the layers are selectively etched in order to form the memory gate stack 60 depicted in FIG. 7 using a single-chamber etching process for etching a plurality of silicon-based layers. In particular, an embodiment of the present invention uses a decoupled plasma source (DPS) poly chamber, as for example, an Applied Materials AMAT DPS Poly chamber from Applied Materials, Inc., Santa Clara, Calif. Normal plasma etch tools use a single power source, referred to as a "source power", with the substrates electrically grounded; alternatively, the substrates may be attached to the source power, and the chamber is electrically grounded. The plasma etch tool controls the source power and affects how much plasma is generated, and also controls the concentration of reactive species, and hence how the reactive species land on the substrate.

In the decoupled plasma source etcher, the power supply is separated into a source power and a bias power. The source power is high power supplied to the chamber wall. The bias power (or "bottom power") power is connected to the substrate. The source power ionizes the gas supplied into the chamber, and generates the reactive species in the chamber. The bias power on the substrate drives the reactive species to accelerate the reactions. Hence, there is more control of the etching process: the source power controls generation of the chemical species and therefore controls the chemical etch portion, and the bias power controls the physical part of the etch, for example the bombardment of the species onto the substrate.

Figure 6:
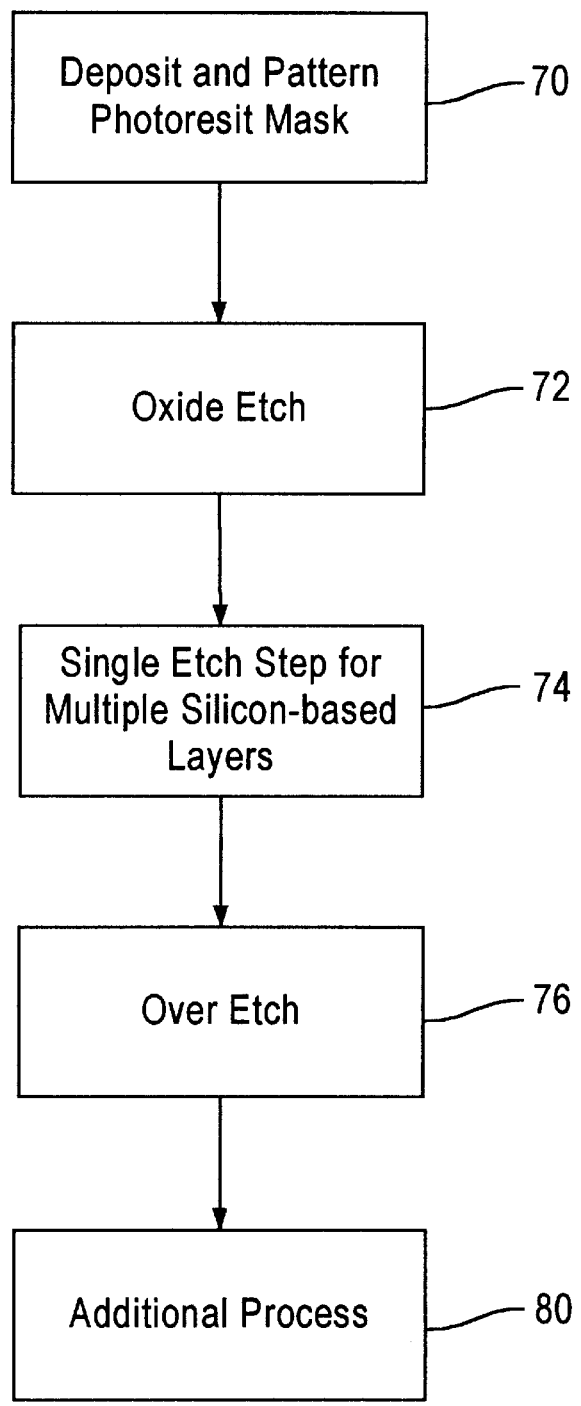
FIG. 6 is a flow diagram summarizing a method of etching a plurality of layers to form a memory gate electrode according to an embodiment of the present invention.

FIG. 6 illustrates a flow diagram summarizing a method for etching a semiconductor substrate having multiple layers to form the memory gate 60 according to an embodiment of the present invention. Initially, a photoresist is deposited and patterned to form a photoresist mask on a semiconductor substrate having layers 15, 16, 24, 62, 64, 66, and 68 on substrate 12. The photoresist mask is patterned employing enhanced deep-UV (DUV) submicron photolithography techniques to form a core mask defining a memory core region of the semiconductor substrate in step 70. The core mask defines the memory core region that requires submicron critical dimensions, as distinguished from periphery devices such as analog drivers that do not require as stringent of control over critical dimensions.

Once the core mask has been formed on the top layer of the semiconductor substrate, the substrate is placed in an oxide etch chamber and the silicon oxynitride layer 68 is then etched in step 72 using an oxide etch environment to generate a patterned silicon oxynitride layer, as shown in FIG. 5 (the photoresist mask is not shown for illustrative convenience).

According to the present invention, polysilicon cap layer 66, silicide layer 64 and polysilicon layer 62 are etched in the DPS poly chamber, without removing the semiconductor substrate, using a polysilicon etch environment in step 74. This is accomplished by employing $Cl_2$ and $O_2$ in the etch environment. Etching the plurality of silicon-based layers in a single step thus reduces the need for a separate polysilicon etching step, thereby reducing manufacturing time and costs. Further, elimination of a polysilicon etch step permits the formation of a thinner polysilicon layer, used as part of the control gate electrode in the memory cell, and achieves better device performance. Moreover, the polysilicon etch environment of the present invention achieves a high selectivity to the underlying dielectric layer thereby avoiding pitting of the dielectric layer.

In an embodiment of the present invention, a semiconductor substrate having a plurality of silicon-based layers is placed in a decoupled plasma etch tool and the chamber conditioned. The chamber pressure is maintained within the range of about 10 mTorr to about 1 mTorr, and the tool power is set within the range of about 500 W to about 1500 W. The temperature of the substrate is maintained at less than about 50° C. and a total gas inlet flow of $Cl_2$ and $O_2$ is maintained from about 50 standard cubic centimeters per minute (sccm) to about 120 sccm. Typical experimental parameters are within the ranges of:

RF source power of about 500 W to about 1500 W

RF bias power of about 50 W to about 200 W

Flow of about 100 sccm

Pressure of about 1 mTorr to about 10 mTorr

Temperature of about 0° C. to about 50° C.

The polysilicon etch environment has an exemplary composition of about 70 sccm to about 50 sccm of $Cl_2$ and about 5 sccm to about 20 sccm of $O_2$. Optionally, nitrogen at about 5 to about 15 sccm can also be present.

In accordance with the present invention a high selectivity to underlying oxide layer 24 is achieved by a polysilicon etch environment comprising $Cl_2$ and $O_2$. For example by employing $Cl_2$ and $O_2$ in a decoupled plasma etch tool and maintaining the substrate at a low temperature, e.g. less than about 50° C., the selectivity to oxide is greater than about 1:1, e.g. greater than about 20:1 and higher than about 35:1.

An over etch of the polysilicon layer 62 is then performed in step 76 of FIG. 6 using HBr. The over etching of layer 62 in step 76 provides an improved landing surface onto the ONO layer 24. Additional processing step 80 includes etching layer 24 using an oxide etch environment, followed by etching of layer 16 thereby exposing tunnel oxide layer 15. Following etching of the stack to expose the tunnel layer 15, the substrate can be processed for spacer oxide formation in further completion of forming the device.

According to the disclosed embodiment, a single etch step is used to etch a plurality of silicon-based layers in forming a memory gate electrode. The etching chamber is configured for etching the semiconductor substrate by selecting a chlorine and oxygen etch chemistry thereby eliminating the necessity for repeated etching steps of the semiconductor substrate for different silicide and polysilicon etching processes. Moreover, the use of a single etch process having a high selectivity to the underlying oxide allows the formation of a thinner control gate.

According to the disclosed embodiment, the Applied Materials AMAT DPS poly etcher is used to etch a poly cap layer, a silicide layer and a polysilicon layer. In addition, the disclosed arrangement provides a much more efficient procedure for controlling the rectangular profile of the etching processes. The DPS poly etcher etches anisotropically. In particular, the DPS poly etcher has independent bias power control, and very low pressure, enabling ions to penetrate with a much higher energy. Finally, the disclosed arrangement provides a significant cost saving, since the number of overall etching steps of the semiconductor substrate is reduced.

The process steps and structures described above do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device, comprising:

a semiconductor substrate;

an insulating layer over the semiconductor substrate;

a floating gate electrode overlying the insulating layer;

a dielectric layer substantially free of pitting therein overlying the floating gate electrode; and a control gate arrangement directly overlying the dielectric layer wherein the control gate arrangement comprises a plurality of silicon-based layers and has a thickness of no greater than about 800 Å.

2. The semiconductor device of claim 1, wherein the control gate arrangement has a thickness of no greater than about 400 Å.

3. The semiconductor device of claim 1, wherein the control gate arrangement has a thickness of no greater than about 200 Å.

4. The semiconductor device of claim 1, wherein the control gate arrangement comprises a polysilicon layer and a silicide layer overlying the polysilicon layer.

5. The semiconductor device of claim 4, wherein the control gate arrangement further comprises a polysilicon cap layer over the silicide layer.

6. The semiconductor device of claim 1, wherein the control gate arrangement is formed by a single etch step.

7. The semiconductor device of claim 6, wherein the control gate arrangement is formed by a single etch step comprising exposing the substrate to a mixture comprising chlorine and oxygen in an etch chamber.

8. The semiconductor device of claim 7, wherein the plurality of silicon-based layers comprise a silicide layer and a polysilicon layer.

9. The semiconductor device of claim 7, comprising maintaining the chamber at a pressure of about 1 mTorr to about 1 mTorr.

10. The semiconductor device of claim 7, comprising maintaining the semiconductor substrate at a temperature of less than 50° C. during the single etch step.

* * * * *